(12) United States Patent
Sullivan et al.

(10) Patent No.: US 9,070,135 B2
(45) Date of Patent: Jun. 30, 2015

(54) AGENT GENERATION FOR AGENT-BASED MODELING SYSTEMS

(71) Applicant: ThinkVine Corporation, Cincinnati, OH (US)

(72) Inventors: Theresa S. Sullivan, Cincinnati, OH (US); Sean P. Tunning, Cincinnati, OH (US)

(73) Assignee: THINKVINE CORPORATION, Cincinnati, OH (US)

( * ) Notice: Subject to any disclaimer, the term of this patent is extended or adjusted under 35 U.S.C. 154(b) by 400 days.

(21) Appl. No.: 13/667,252

(22) Filed: Nov. 2, 2012

(65) Prior Publication Data

US 2013/0110481 A1    May 2, 2013

Related U.S. Application Data

(60) Provisional application No. 61/554,568, filed on Nov. 2, 2011.

(51) Int. Cl.
| | |
|---|---|
| *G06Q 30/02* | (2012.01) |
| *G06Q 30/00* | (2012.01) |
| *G06F 17/18* | (2006.01) |
| *G06F 17/50* | (2006.01) |

(52) U.S. Cl.
CPC ............ *G06Q 30/0201* (2013.01); *G06F 17/18* (2013.01); *G06F 17/5009* (2013.01); *G06Q 30/0202* (2013.01); *G06Q 30/0204* (2013.01); *G06Q 30/00* (2013.01)

(58) Field of Classification Search
None
See application file for complete search history.

(56) References Cited

U.S. PATENT DOCUMENTS

| | | | |
|---|---|---|---|
| 6,154,731 A | 11/2000 | Monks et al. | |
| 7,899,767 B2 * | 3/2011 | Nakatsugawa et al. | 705/12 |
| 8,015,127 B2 * | 9/2011 | Narzisi et al. | 706/13 |
| 2003/0154092 A1 * | 8/2003 | Bouron et al. | 705/1 |
| 2003/0177055 A1 * | 9/2003 | Zimmerman et al. | 705/10 |
| 2003/0187708 A1 | 10/2003 | Baydar et al. | |
| 2007/0073723 A1 | 3/2007 | Ramer et al. | |
| 2007/0162372 A1 * | 7/2007 | Anas | 705/35 |
| 2007/0179363 A1 | 8/2007 | Stupp et al. | |
| 2008/0215512 A1 | 9/2008 | Narzisi et al. | |
| 2010/0205034 A1 * | 8/2010 | Zimmerman et al. | 705/10 |
| 2011/0087625 A1 | 4/2011 | Tanner, Jr. et al. | |
| 2011/0106743 A1 | 5/2011 | Duchon | |

(Continued)

OTHER PUBLICATIONS

Schramm, Mary, et al. "An Agent-Based Diffusion Model with Consumer and Brand Agents" Decision Support Systems, vol. 50, pp. 234-242 (Aug. 2010).*

(Continued)

*Primary Examiner* — Kamini S Shah
*Assistant Examiner* — Jay B Hann
(74) *Attorney, Agent, or Firm* — Thompson Hine LLP

(57) ABSTRACT

A method for assigning an attribute to an agent for use in an agent-based model, including receiving or selecting a first numerical value for assigning an attribute of an agent in an agent-based model. The method further includes receiving or selecting a random numerical value, blending the first and random numerical values, resulting in an intermediate value, and blending the intermediate result with the first numerical value, or the random numerical value, or with a second numerical value, resulting in an end value. The method further includes utilizing the end value to assign the attribute of the agent in the agent-based model.

18 Claims, 6 Drawing Sheets

| $u_1$ UNIFORM AGE DRAW | $G^{-1}(u_1)$ AGE | $u_2$ UNIFORM RANDOM DRAW | $g(u_1, u_2)$ BLENDED DRAW | $g(g(u_1, u_2), u_1)$ RE-BLENDED DRAW | $F^{-1}g(g(u_1, u_2), u_1)$ INCOME |
|---|---|---|---|---|---|
| 0.6 | 40 | 0.2 | 0.3 | 0.4 | 45,000 |
| 0.3 | 22 | 0.4 | 0.2 | 0.1 | 20,000 |
| 0.5 | 35 | 0.6 | 0.6 | 0.6 | 58,000 |
| 0.1 | 17 | 0.7 | 0.3 | 0.1 | 20,000 |
| 0.4 | 29 | 0.1 | 0.1 | 0.1 | 20,000 |
| 0.1 | 17 | 0.9 | 0.5 | 0.2 | 25,000 |
| 0.8 | 57 | 0.5 | 0.8 | 0.9 | 115,000 |

(56) References Cited

U.S. PATENT DOCUMENTS

2011/0119201 A1    5/2011    Zimmerman, Jr. et al.
2013/0124164 A1*   5/2013    Jha et al. .......................... 703/2

OTHER PUBLICATIONS

Stolfo, et al. "Cost-Based Modeling for Fraud and Intrusion Detection: Results from the JAM Project" (2000).*

Said, Lamjed, et al. "Agent-Based Interaction Analysis of Consumer Behavior" ACM, In Proceedings of the First Int'l Joint Conf. on Autonomous Agents & Multiagent Aystems: Part 1, pp. 184-190 (2002).*

Bonabeau, Eric "Agent-Based Modeling: Methods and Techniques for Simulating Human Systems" PNAS, vol. 99, suppl. 3, pp. 7280-7287 (2002) available from <http://www.pnas.org/content/99/suppl_3/7280.full>.*

Basu, N., et al. "ASPEN: A Microsimulation Model of the Economy" Computational Economics, vol. 12, pp. 223-241 (1998).*

International Search Report and Written Opinion, PCT/US2012/063151. (Jan. 8, 2013).

Garcia, Rosanna et al. "Validating agent-based marketing models through conjoint analysis," Journal of Business Research, vol. 60, Issue 8, pp. 848-857. (2007).

Midgley, David et al. "The Building and Assurance of Agent-Based Models: An Example and Challenge to the Field," Journal of Business Research, vol. 60, Issue 8, pp. 884-893. (2007).

Thomas, James D. et al. "Heterogeneity, Root-nding, and Decentralization," published in Artificial Societies and Computational Markets Workshop of the Second International Conference on Autonomous Agents. (1998).

* cited by examiner

| $u_1$ UNIFORM AGE DRAW | $G^{-1}(u_1)$ AGE | $u_2$ UNIFORM RANDOM DRAW | $g(u_1,u_2)$ BLENDED DRAW | $F^{-1}(g(u_1,u_2))$ INCOME |
|---|---|---|---|---|
| 0.6 | 40 | 0.2 | 0.3 | 35,000 |
| 0.3 | 22 | 0.4 | 0.2 | 25,000 |
| 0.5 | 35 | 0.6 | 0.6 | 58,000 |
| 0.1 | 17 | 0.7 | 0.3 | 35,000 |
| 0.4 | 29 | 0.1 | 0.1 | 20,000 |
| 0.1 | 17 | 0.9 | 0.5 | 50,000 |
| 0.8 | 57 | 0.5 | 0.8 | 80,000 |

FIG. 5

| $u_1$ UNIFORM AGE DRAW | $G^{-1}(u_1)$ AGE | $u_2$ UNIFORM RANDOM DRAW | $g(u_1,u_2)$ BLENDED DRAW | $g(g(u_1,u_2),u_1)$ RE-BLENDED DRAW | $F^{-1}g(g(u_1,u_2),u_1)$ INCOME |
|---|---|---|---|---|---|
| 0.6 | 40 | 0.2 | 0.3 | 0.4 | 45,000 |
| 0.3 | 22 | 0.4 | 0.2 | 0.1 | 20,000 |
| 0.5 | 35 | 0.6 | 0.6 | 0.6 | 58,000 |
| 0.1 | 17 | 0.7 | 0.3 | 0.1 | 20,000 |
| 0.4 | 29 | 0.1 | 0.1 | 0.1 | 20,000 |
| 0.1 | 17 | 0.9 | 0.5 | 0.2 | 25,000 |
| 0.8 | 57 | 0.5 | 0.8 | 0.9 | 115,000 |

FIG. 6

| $u_1$ UNIFORM AGE DRAW | $G^{-1}(u_1)$ AGE | $u_2$ UNIFORM RANDOM DRAW | $g(u_1, u_2)$ BLENDED DRAW | $u_3$ UNIFORM RANDOM DRAW | $g(g(u_1, u_2), u_3)$ RE-BLENDED DRAW | $F^{-1}g(g(u_1,u_2),u_3)$ INCOME |
|---|---|---|---|---|---|---|
| 0.6 | 40 | 0.2 | 0.3 | 0.5 | 0.3 | 35,000 |
| 0.3 | 22 | 0.4 | 0.2 | 0.5 | 0.2 | 25,000 |
| 0.5 | 35 | 0.6 | 0.6 | 0.2 | 0.3 | 35,000 |
| 0.1 | 17 | 0.7 | 0.3 | 0.8 | 0.6 | 58,000 |
| 0.4 | 29 | 0.1 | 0.1 | 0.6 | 0.2 | 25,000 |
| 0.1 | 17 | 0.9 | 0.5 | 0.2 | 0.2 | 25,000 |
| 0.8 | 57 | 0.5 | 0.8 | 0.1 | 0.4 | 45,000 |

AGENT GENERATION FOR AGENT-BASED MODELING SYSTEMS

This application claims priority to U.S. Provisional Patent Application Ser. No. 61/554,568, filed on Nov. 2, 2011, the entire contents of which are incorporated by reference herein.

The present invention is directed to an agent-based modeling system, and more particularly, to an agent generation system for use with an agent-based modeling system.

BACKGROUND

Agent-based systems and models may be used to simulate human or other behavior in a wide variety of settings and fields, such as purchasing activity, social interaction, traffic flow, logistics, biomedical, portfolio management, population dynamics, combat behavior and others. Such agent-based systems typically must first create a set of agents and assign a set of characteristics and/or attributes to the agent. However, most existing agent-generation systems, particularly purchase forecast agent-generation systems, fail to develop a sufficiently diverse set of agents that accurately reflect real-world conditions.

SUMMARY

In one embodiment, the present invention is a method for assigning an attribute to an agent for use in an agent-based model. The method includes receiving or selecting a first numerical value for assigning an attribute of an agent in an agent-based model. The method further includes receiving or selecting a random numerical value, blending the first and random numerical values, resulting in an intermediate value, and blending the intermediate result with the first numerical value, or the random numerical value, or with a second numerical value, resulting in an end value. The method further includes utilizing the end value to assign the attribute of the agent in the agent-based model.

BRIEF DESCRIPTION OF DRAWINGS

FIG. 5 is a sample chart showing results under a second method for selecting a correlated agent variable (income) based upon another variable (age);

FIG. 6 is a sample chart showing results under a third method for selecting a correlated agent variable (income) based upon another variable (age);

DETAILED DESCRIPTION

1. Overview

Figure 1:
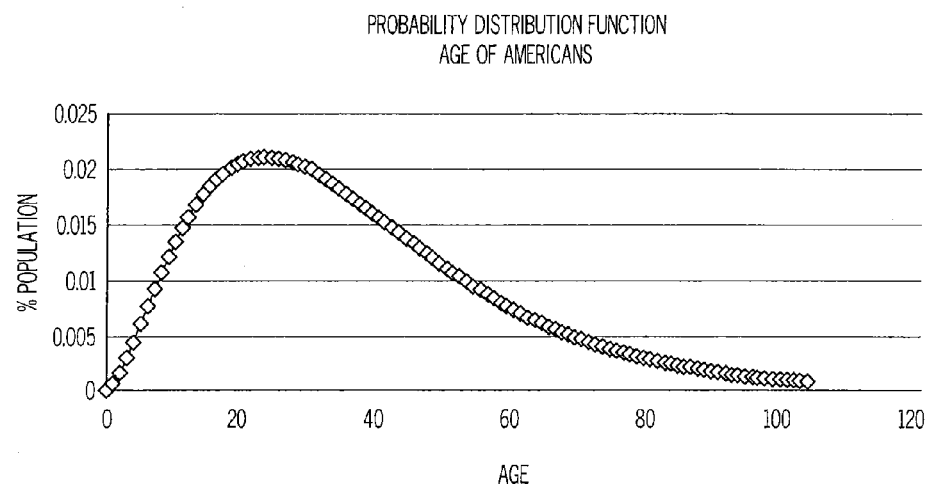
FIG. 1 is a sample graph showing a probability density function of age for a sample population.

The present invention takes the form of, or may be used in conjunction with, an agent-based modeling system, alternately termed an agent-based model ("ABM"). In such a system, a number of agents are created and various attributes/characteristics are assigned to each agent. Each agent can correspond to a decision-making entity, such as an individual person, organization, or organism in one case. Behavioral rules and constraints regarding the agents' behavior and interaction are then created and applied, as appropriate, to match the simulation/environment at issue. The ABM is then calibrated using test-run simulations or calibration simulations to ensure that the model, agent characteristics and other assumptions are appropriate and lead to accurate outcomes as compared to historical data. After the model and other underlying assumptions/characteristics are sufficiently calibrated and validated, the final or "actual" simulation is run. During a calibration or actual simulation, each agent can make decisions and react to input/stimuli on an individual basis, based upon the input/stimuli and the agent's own characteristics and constraints. The resultant behavior of each agent is tracked and recorded. Once the simulation is concluded, the outcomes of each agent, and the system as a whole, can be processed, analyzed and reviewed to extract appropriate data.

In one particular embodiment described herein, the agent-based system or ABM is used to determine consumer behavior (particularly purchasing behavior) in response to particular marketing activities. Accordingly, this particular example is described in some detail herein to illustrate the various principles of the invention(s). However, it should be understood that the systems and methods described herein are not necessarily limited to such purchasing/marketing simulations, and the systems and methods described herein can be used in any of a wide variety of agent-based systems or ABMs.

2. Agent Generation

As outlined above, a preliminary step in creating and utilizing the agent-based system involves the creation of the agents. The number of agents will vary depending upon the granularity of the desired results, time and cost limitations, computing power limitations, the type and nature of simulation, etc. In one case, however, the number of agents ranges between about 20,000 and about 1,000,000. Each agent may or may not be assigned a unique identifier, after which the agent is assigned various attributes, characteristics, qualities and the like (collectively termed attributes, or parameters, or variables herein). The type and number of attributes assigned to an agent will vary depending upon the nature of the simulation and the agent-based system. In cases for systems used for tracking or predicting purchase behavior and/or the effectiveness of advertising, the attributes can include sex, age, race, income, TV watching habits, Internet usage habits, radio listening habits, price sensitivity, historical purchase occasions, quality sensitivity, etc. The number of attributes can vary as desired, in one case the number of attributes is between about five and about fifty.

In order to assign attributes to the agents, various data sources may be referenced as a starting point for certain characteristics, such as age, race, income, geographic location, etc. For example, census data, data from marketing research organizations and information-gathering organizations, information from a particular client or customer for whom the simulation will be performed, or other sources, may be referenced. The population data may then, in some cases, be culled as appropriate, by, for example, limiting populations to those geographic areas where a product is available for purchase, or limiting population by legal age where the simulation involves the purchase of alcoholic products, etc.

Next, correlations between the attributes, and a natural order to the correlated variables, may be assigned. For example, a person's income may be assumed for the purpose of the simulation/system to be correlated to his or her race and gender. However, a real consumer's race and gender were "assigned" before his or her income. In this case, if in reality there is a causal direction, race and/or gender may be considered causal or predictive attributes or values, and income may be considered a resultant attribute or value, as an example.

Figure 2:
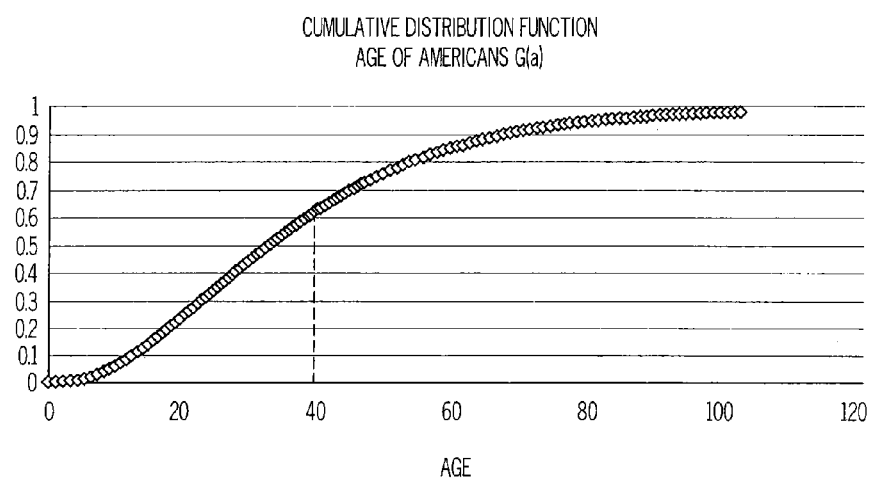
FIG. 2 is a sample graph showing a cumulative distribution function of age for a sample population.

Based upon the available, pertinent data, a probability density function ("PDF") for an attribute, such as age, may be generated or obtained. FIG. 1 illustrates an example of a probability density function for age as a percent of population. Thus, the graph of FIG. 1 shows what percent of the population (on the vertical axis) has a given age (along the horizontal axis). In order to facilitate use with the current system, a probability density function, such as that shown in FIG. 1, is typically converted to a cumulative distribution function, such as that shown in FIG. 2. Thus, the cumulative distribution function G(a) of FIG. 2 shows what percent, or what ratio, of the population (along the vertical axis) has at most a given age (along the horizontal axis). Thus, in the example marked on FIG. 2, 0.6 ratio of the population (i.e. 60%) has an age of at most about 40. The function G(a) of FIG. 2 illustrates a uniformly distributed variable/attribute in that it is normalized between 0 and 1 on the vertical axis, and all values on the vertical axis are equally selectable.

Once a cumulative distribution function for a particular attribute is generated/obtained (such as that shown in FIG. 2), the cumulative distribution function can be disaggregated and broken down such that particular ages can be assigned to particular agents. In order to do this, a random number (between 0 and 1) is sampled from a uniform distribution. The inverse of the sampled random number in the cumulative distribution function for age (G(a)) is then calculated. For example, if the random number generator generates a number of 0.6 (the random draw), the cumulative distribution function of FIG. 2 determines that the inverse of the 0.6 value is age 40, which is then assigned to a particular agent (it is noted that very rough numbers are used herein for the draw, age, and other data for ease of illustration, and in actual use the data will typically have greater precision).

The process can then be repeated for each agent, generating a separate random number draw for each agent until the population of agents have their assigned ages. In this manner, the age assignment process can be described as taking the inverse $G^{-1}(a)$ of a collection of random draws on a uniform distribution. This system and methodology can also be applied to attributes which have discrete values (such as gender and race) instead of more continuously variable values such as income, using well-known techniques involving step-function forms for the inverses of the cumulative distribution function graphs.

If desired, this process of taking the inverse of a uniform distribution can be repeated for other variables/attributes besides age, such as gender, race and the other variables/attributes outlined above. In some systems, independent uniform random draws utilized are for each of the variables/attributes of a single agent (i.e. a new random number is generated for each attribute). In this case, however, there will not typically be any correlation between the variables/attributes, which results in agents having unrealistic characteristics.

Figures 3, 4:
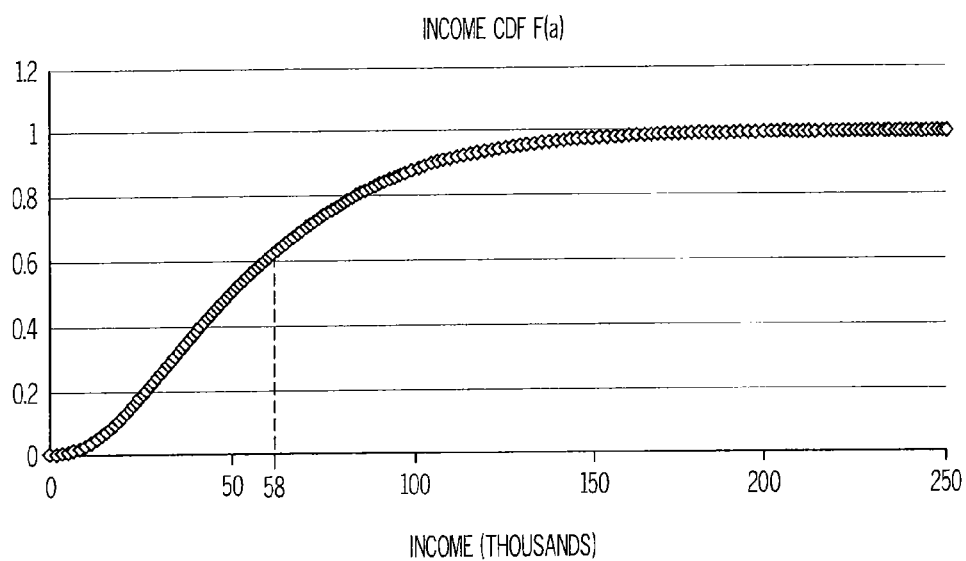
FIG. 3 is a sample graph showing a cumulative distribution function of income for a sample population.
FIG. 4 is a sample chart showing results under a first method for selecting a correlated agent variable (income) based upon another variable (age)

For example, in one case, in other systems a single uniform random draw is utilized across the board for all of the agent's variables/attributes. For example, in such a case the 0.6 number in the example above used to determine the agent's age is also is used to determine the agents' gender, race, income and other attributes by applying (i.e. inverting) the 0.6 number to/in cumulative distribution functions for those attributes. In other words, one uniform draw is utilized as an input to generate all or several attributes for the agent. In this case, as shown in FIG. 3, an application of the 0.6 random draw results in an income of $58,000.

However, this approach of using the same uniform random draw fails to create an accurate model of real-world conditions. In particular, in such an approach, the age of the agent essentially acts as the sole determiner of the agent's income and other attributes, such that in the example set forth above the agent would be in the "top 60%" for all attributes; and in this example each 40 year would have an income of $58,000. However, this is of course not an accurate model of the diversity of characteristics present in the real world. While this uniform approach ensures a correlation between related variables (i.e. age and income), the correlation is too strong and does not sufficiently take into account the variability of attributes of real world individuals.

Accordingly, in order to provide more accurate attributes to the agents, the input values for determining one of the agent's attributes (i.e. age) can be blended with a random number draw (i.e. unrelated to age or other sampled variables) to create a new set of input values for determining a correlated attribute (i.e. income). This system enables the resultant agent population to have more realistic, diverse attributes with a correlation (but not a strict correlation) between the attributes. For example, the chart shown in FIG. 4 illustrates age and income attributes of various agents (it should be understood, of course, that the number of agents in an actual simulation can significantly exceed the number shown in FIG. 4). The first column of the chart illustrates the age draw $u_1$ for the agents, beginning with the example of 0.6, as the uniform age draw, as addressed above. As can be seen in the chart, the age draw of 0.6, when applied as an input/inverted in the age cumulative distribution function (such as that of FIG. 2), provides an age value of 40. When the draw of 0.6 is applied as an input/inverse to the income cumulative distribution function (such as that of FIG. 3), an income of $58,000 results. Various other outcomes can be seen in the chart of FIG. 4, in which it can be seen that income and age have a strict correlation.

In contrast, the chart of FIG. 5 illustrates the system outlined above in which blended draws are utilized. In the chart of FIG. 5, the age draw and inverse functions in the first two columns remain the same as those in FIG. 4. However, the third column of the chart of FIG. 5 illustrates another uniform random draw $u_2$, which is then blended with the age draws of the first column $u_1$, resulting in the blended variable $g(u_1, u_2)$ of the fourth column. Finally, the fifth column of the table of FIG. 5 illustrates the income attribute which is ultimately assigned to the agent based upon the input/inverse of the fourth column.

Both the age draw $u_1$ and the uniform random draw $u_2$ are uniformly-distributed variables. In order to form the blended variable $g(u_1, u_2)$ in the fourth column, the uniformly distributed variables $u_1$, $u_2$ must be blended together in such a way to result in another uniformly-distributed variable $g(u_1, u_2)$ that is related to, and has some correlation to, both of the input variables $u_1$, $u_2$. Thus, in order to blend the uniformly-distributed variables $u_1$, $u_2$, the following methodology may be used.

Since $u_1$ and $u_2$ are uniformly distributed random variables, they can be blended to form a blended uniformly distributed variable $g(u_1, u_2)$. In one case, the following equation can be used:

$$g(u_1, u_2) = \begin{cases} \dfrac{(u_1 + u_2)^2}{2} & \text{if } u_1 + u_2 < 1 \\ \dfrac{(2 - (2 - u_1 - u_2)^2}{2} & \text{otherwise} \end{cases} \quad \text{Equation 1}$$

The resultant function $\{g(u_1, u_2); u_1, u_2 \text{ uniform}\}$ generated by using Equation 1 is uniformly distributed, as can be seen by the following proof. In particular, it can be shown that the cumulative distribution function of the above set given $u_1+u_2<1$ is the identity, which implies that the probability density function is a constant (one). We then provide a transformation of the alternate case that shows that the same proof can be applied.

Suppose that $0<F<\frac{1}{2}$. It can be easily shown that $g(u_1,u_2)<F<\frac{1}{2}$ only if $u_1+u_2<1$ so without loss of generality, $g(u_1, u_2)<F$ if and only if $0<u_1<\sqrt{2F}$ and $0<u_2<\sqrt{2F}-u_1$. Because the probability density function of $u_1$ and $u_2$ are both identically one, $$Prob(g(u_1, u_2) < F) = \int_0^{\sqrt{2F}} \left( \int_0^{\sqrt{2F}-u_1} du_2 \right) du_1$$

So $$Prob(g(u_1, u_2) < F) = \int_0^{\sqrt{2F}} [u_2]_0^{\sqrt{2F}-u_1} du_1$$

$$= \int_0^{\sqrt{2F}} (\sqrt{2F} - u_1) du_1$$

$$= \left[ \sqrt{2F}\, u_1 - \frac{u_1^2}{2} \right]_0^{\sqrt{2F}}$$

$$= 2F - \frac{1}{2}(2F) = F$$

It remains to be shown that if $\frac{1}{2}<=F<1$ then $$Prob(g(u_1,u_2)<F)=Prob(g(u_1,u_2)<\tfrac{1}{2})+Prob(\tfrac{1}{2}<g(u_1,u_2)<F)=F$$

This is equivalent to showing that $Prob(\frac{1}{2}<g(u_1, u_2)<F)=F-\frac{1}{2}$. We know that we are using the second range in our functional definition, so g falls in this range if and only if $$\frac{1}{2} < \frac{2 - (2 - u_1 - u_2)^2}{2} < F$$

A simple translation to $$v_1 = 1 - u_1$$

$$v_2 = 1 - u_2$$

$$G = 1 - F$$

Shows us that g is in the range if and only if $$\frac{1}{2} < \frac{(2 - (v_1 + v_2)^2)}{2} < 1 - G, \text{ if and only if}$$

$$G < \frac{(v_1 + v_2)^2}{2} < \frac{1}{2}$$

This puts us back in the space of the original proof. We subtract the probability below G and get $$Prob\left(G < g(u_1, u_2) < \frac{1}{2}\right) = Prob\left(g(u_1, u_2) < \frac{1}{2}\right) - Prob(g(u_1, u_2) < G)$$

$$= \left(\frac{1}{2}\right) - Prob(g(u_1, u_2) < G)$$

$$= \frac{1}{2} - G = F - \frac{1}{2}$$

Thus, the function outlined above (Equation 1) may be used to blend the variables in the manner outlined above, resulting in a uniformly blended output; i.e. in which a histogram of the outputs is between 0 and 1, meaning all values in that interval are generally equally represented. If the relationship between the prior or causal variable and the resultant variable is negative, this can be accommodated by transforming the uniform draw for the prior variable, U, to 1−U before blending. This system and method for blending variables avoids having to utilize joint distributions, which requires unknown data, and avoids having to know or estimate conditional probabilities that are required in order to carry out Gibbs' sampling.

In addition, the system outlined above can be modified such that the system is assigned attributes in a related manner to drive or dilute the desired correlation in the end result. For example, rather than simply blending the age draw with a random draw to arrive at the blended number, that blended number (i.e. an intermediate value) may then, in turn, be blended with the age draw, as shown in the table of FIG. 6. The first four columns of FIG. 6 are the same as those of FIG. 5. However, as shown in the fifth column of the table of FIG. 6, the draws of the first and fourth columns are be "re-blended." The resultant re-blended draw in the fifth column of FIG. 6 $g(g(u_1, u_2), u_1)$ (i.e. an end value) is more closely (but not entirely) correlated with the uniform age draw than the blended draw $g(u_1, u_2)$ of FIG. 5. This means that the resultant income assigned to that agent is more closely (but not entirely) correlated with age.

In order to blend the blended draw $g(u_1, u_2)$ with the age draw $(u_1)$ to provide the re-blended draw, the same function g outlined above in Equation 1 may be used to again blend the desired functions, resulting in the function $g(g(u_1, u_2), u_1)$. The result of such a re-blending is shown in the table of FIG. 6. This resultant outcome (income) is on the average more closely tied to age than the table of FIG. 5, but also does not have the strict correlation of the table of FIG. 4. If desired, the re-blended variable $g(g(u_j, u_2), u_1)$ can be again blended with the age draw $u_1$, or with other draws, to provide the desired correlation between the two or more attributes.

Figures 7, 8A, 8B, 8C:
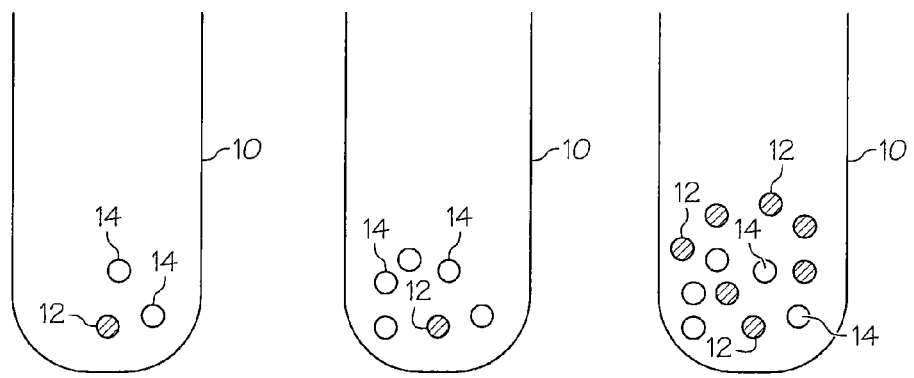
FIG. 7 is a sample chart showing results under a fourth method for selecting a correlated agent variable (income) based upon another variable (age)
FIG. 8A-8C illustrate a series of steps showing an awareness model.

Alternately, if the attribute/variable is desired to be diluted, another random draw $u_3$ may be blended with the blended draw $g(u_1, u_2)$, as shown in the table of FIG. 7. In this case, the resultant outcome (income) is on the average less closely correlated with age than the table of FIG. 5. In this manner, the system allows variables to be sampled with correlation to the previously-sampled variables with the desired strength of relation/desired randomness to suit the desires of the designer/user of the system. In contrast, a strict, one-step blending does not provide flexibility to the designer to allow the draw to be structured as desired.

Thus, broadly speaking, the system involves, in one case, three steps: 1) choosing an order to the variables; 2) sampling the "early" or "causal" attributes in the standard manner outlined above; that is, obtaining a cumulative distribution function and sampling a random, uniformly-distributed variable, and taking the inverse of draws of that variable in that function; and 3) for any variable that is correlated to one or more of the earlier or causal variables, blending the value of the random draw variable used to sample the earlier/causal variable with another truly random uniform variable. The resultant uniformly-distributed variable is then blended with others until a variable that is uniformly distributed, but correlated to previously-sampled variable(s), results. That blended, uniformly-distributed variable is then used to sample the correlated variable.

The blending process can be done repeatedly, in as many combination as desired, although it is not possible to be done fractionally. For example, if the relationship between two variables/attributes is desired to be relatively strong, the input value that was used to sample the first variable could be re-blended, with the blended variable, as many times as desired. On the other hand, if it is desired to make the variables/attributes more independent, the resultant, blended variable could be sampled with a purely random, uniformly-distributed variable as many times as desired. Multiple variables/attributes, and multiple random number draws, may be blended as desired. The resultant system introduces some randomness/variability into the system, in the desired manner, such that agents having more accurate, real-world attributes are provided, which can result in more accurate simulations.

3. Awareness Model

After the agents are created, and their attributes assigned, in many cases an agent is assigned an awareness attribute or value which is taken into consideration during the simulation. For example, in purchasing or marketplace agent-based models, the agent must first be known to be aware of a product or brand before he or she can purchase the particular product or brand. Thus, in many existing models, the agent's awareness is treated as a binary on/off characteristic. An agent's lack of awareness acts as a barrier to purchase, and conversely and agent's awareness of the brand/product means the agent is eligible to purchase the brand/product.

The ABM system described herein may utilize an Awareness Frequency Ratio ("AFR") which represents the percentage of stimuli or other cues which the agent encounters which cause the agent to think about a given brand. The higher the AFR for an agent, the more prone the agent is to purchase the particular associated good during a purchase opportunity. Thus, in such a model, it may be a primary goal of advertising to generate as many connections as possible, thereby increasing the AFR the agents. Each agent also has a purchase probability ("PP") that is independent of the agent's awareness or AFR. The purchase probability may represent the agent's propensity to buy the particular item when the agent is "perfectly" aware of the item and in the position to purchase (e.g. at a store or on a purchase-enabled website), and each agent's PP may be independent of other agents' PP.

If the agent is unaware of the particular item (i.e. AFR is zero), the agent is precluded from purchasing the item, no matter how much the agent might be likely to buy the item if the agent were aware. Thus, purchase probability and AFR work together in the simulation to predict agent purchasing behavior. In one embodiment, the present system models awareness, or AFR, as a dynamic characteristic which varies over time, and can change based upon each individual agent's experiences and attributes.

In one embodiment, the present system models awareness based upon a process that can be considered similar to a Polya Urn model, but with certain variations. The Polya Urn model can be visualized in considering an "urn" or container that stores a predetermined number of items, such as balls, therein. Various types of balls (such as black and white, in one case) are stored in the urn. In this scenario, the black balls are reminders of a given brand, and the white balls are reminders of a competitor.

When there is a triggering event, the model simulates the random selection of a ball from the urn. Once a ball has been selected, it is identified (i.e., white or black). The original selected ball is then placed in the urn, along with another ball of the same color. The process of selecting a ball, and replacing the ball along with another of the same color, is repeated for a number of trials. As the number of trials approaches infinity, the proportion of ball in the urn reaches a beta distribution across the population of agents.

The present system models agent's awareness using the self-reinforcing principles of Polya Urn, but it is distinctly different from the Polya Urn model. For example, as shown in FIG. 8A, each agent may have an associated virtual urn or container 10 which stores a number of virtual indicators, such as black balls 12 and white balls 14 therein. As in the example set forth above, the black balls 12 are reminders of a given brand, and the white balls 14 are reminders of another brand. The number and ratio of balls 12, 14 in the urn 10 at the beginning of the simulation may represent the number of recent previous mental reminders or brand associations for an agent. Alternately, if desired, the urn 10 may not have any balls 12, 14 therein at the start of the simulation.

When the agent experiences a triggering event, a certain number of balls 14, 16 are added to the urn 10. The triggering event can take any wide variety of forms. In one case, however, the triggering event takes the form of a purchase activity by the agent, or a marketing experience by the agent (i.e. viewing or experiencing a marketing message), or a distribution event (i.e. viewing the product in a format available for purchase; such as sitting on a shelf at a store or available for on-line purchase). The number of balls to be added to each agent's urn for a triggering event can vary, and may be selected/optimized to provide the most accurate results, such as by the optimization process described in the next section. In one embodiment, each agent in the simulation receives the same number of balls for each triggering event.

In one embodiment, for example, when an agent views a television advertisement for the white product, three white balls 14 are added to each agent's urn, as shown in FIG. 8B. When an agent views an advertisement for the black product when visiting a web site, five black balls 12 are added to each agent's urn 10, as shown in FIG. 8C. In this example, then, the agent may be more sensitive to interne advertising than television advertising, and this is reflected in the number of balls added to the agents' urns.

As noted above, various parameters of the model can be modified as desired. For example, the number of starting balls (if any) in the urn, the number of types of balls, how many balls are added upon a triggering event, what constitutes a triggering activity, and other parameters may be varied. Each agent can have more or less sensitivity to advertising (or differing types of advertising), or to purchases activities (or differing types of purchase activities), or to distributions (or to differing types of distribution). Moreover, rather than adding balls upon a triggering event, balls could instead or in addition be removed to arrive at the desired ratio of balls.

In addition, the awareness model may have a "decay rate" such that randomly-selected balls or portions thereof are removed from the urn 10 at predetermined intervals. This decay rate is selected to model real-world conditions wherein marketing experiences can be forgotten or replaced over time. In this case, then, the passage of time (i.e. simulated passage of time in the model) can be considered a triggering event, causing balls to be removed.

This system/model can be seen to accurately model human behavior, and is self-reinforcing in that the purchase triggering activities add more balls of the appropriate color to the agent's urn, and thereby make subsequent purchases more likely.

The AFR for each agent can be calculated by taking the ratio of balls of differing types/colors at any one time. Thus, awareness can be considered to be modeled based upon the frequency of reminders experienced by each agent, and the agent's receptiveness to the type of reminders. The AFR for each agent can then be utilized in simulations to determine purchase behavior, i.e. considering both agent preference and awareness. For example, in a simplistic model an agent's AFR is multiplied by the agent's PP, when the agent is in a position to make a purchase, to determine whether the agent makes the purchase.

4. Auto Calibration

Various parameters of the system may need to be calibrated to the appropriate values before the simulation is run. In many cases, the owner/operator/model builder of the ABM system is provided with historical data. For example, in the marketing/sales ABM example addressed herein, the system operator may be provided with historical sales data for a particular product (or class of products) of interest. The operator of the system may also be provided with various historical inputs, such as marketing efforts, including types of marketing efforts, market reach of the marketing efforts, duration of the marketing efforts, etc. associated with the historical sales data. In this manner before the ABM system is operated to simulate projected or future sales, the system can first be run upon known inputs, and compared to known outputs (i.e. historical sales data) to determine the accuracy of the model. The model parameters can then be adjusted in an appropriate manner until the model provides an accurate output, in a calibration process.

Figure 9:
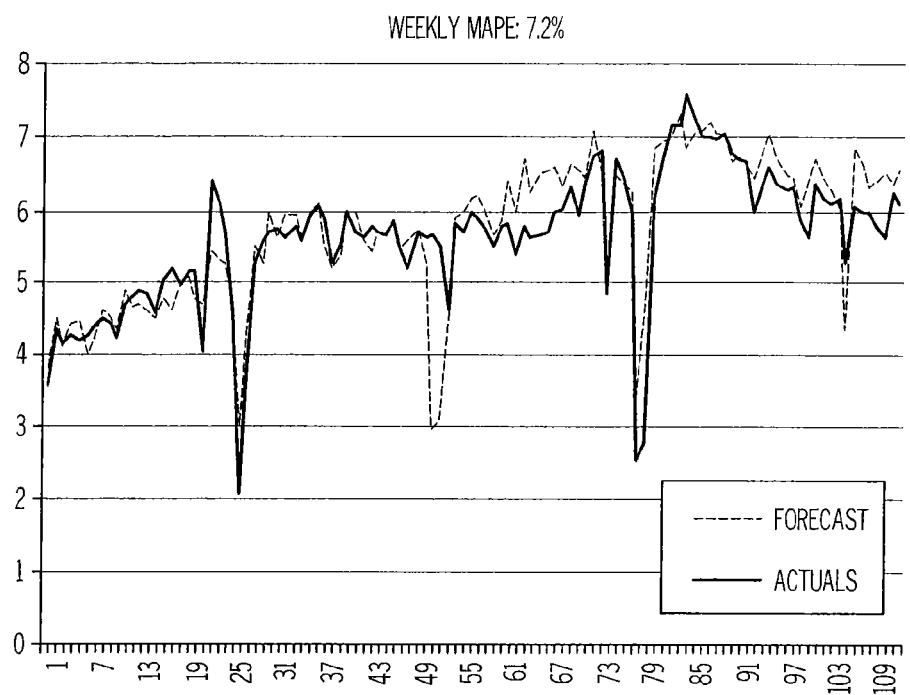
FIG. 9 is a graph illustrating actual sales data compared to estimated sales, over time, for a particular simulation.

FIG. 9 illustrates a graph showing actual sales of a particular product, or class of products, over time. The graph of FIG. 9 also includes forecast/projected sales data based upon a simulation using the ABM system. As can be seen, the forecast output differs from the actual sales data. The auto calibration system/algorithm outlined herein can be utilized to automatically calibrate the system variables/parameters to reduce or minimize the error between forecast/projected sales and actual sales. Once the error is minimized in the auto calibration process, the simulation can be run for future/projected sales data based upon the parameters and inputs which supply minimal error in the calibration.

As shown in the graph of FIG. 9, the forecast/modeled/estimated sales data will differ from the actual sales data, typically underestimating and overestimating sales at differing times. Each such projection, such as the one shown in the graph in FIG. 9, provides a total error measurement known as Mean Absolute Percentage Error ("MAPE"). MAPE represents the average absolute percent error between the actual data and forecast data. The "Error" in the Mean Absolute Percentage Error can be roughly visualized as the distance between the forecast and actual sales graphs at particular intervals (e.g., weekly intervals in one case). In the example of FIG. 9, the MAPE is identified as 7.2%. In general, the auto calibration system may seek to minimize MAPE, although, as will be described in greater detail below, the system may also seek to optimize certain other features.

Broadly speaking, in order to minimize MAPE (or some other value, which may be desired to be optimized/minimized), a simulation under a set of circumstances for a set period of time is run, and the MAPE value for the simulation is calculated and noted. One or more parameters are then varied, and the simulation is run again with the varied parameters/inputs. The MAPE of the resultant, second run is then reviewed. The MAPE from the first run and the second run are compared and utilized to project the next change to be instituted to the variable or variables of interest. In one embodiment, as will be described in greater detail below, the system uses a modified version of Newton's Method to calculate the next value to be tried for the variable. These steps are repeated until a local or inferred curve or graph of MAPE with respect to a particular variable or variables is generated/projected, and/or the zero or minimum error of the MAPE curve with respect to the variable(s) are sufficiently identified or estimated, or the maximum number of iterations is reached.

Figure 10:
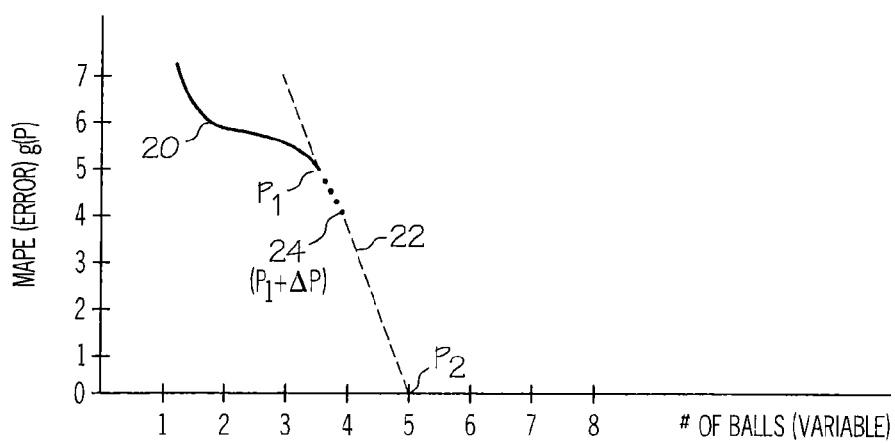
FIGS. 10 and 11 graphically illustrate certain steps of a method for optimization of a variable.

For example, with reference to FIG. 10, the line 20 plotted therein (g(P)) represents the values of MAPE of simulations carried under a certain set of parameters and assumptions, wherein one of the variables is modified. The slope of the tangent line 22 at a particular point (the end or adjacent to the end, in the illustrated embodiment) of the line 20 can be considered to represent the (partial) derivative of MAPE with respect to the variable of interest. The tangent line itself is the best local estimate for the error as a function of this parameter. For example, in the particular illustrative case shown in FIG. 10, the variable of interest (the variable being modified along the x axis) is the number of balls added to the awareness model urn for a certain triggering event, such as exposure to watching a television advertisement.

When approximating the zeros of a differentiable function, Newton's Method directs one to begin at a point, evaluate the function and calculate its slope/derivative and (assuming the derivative is non-zero) move to the X-value where the intercept would be if the slope at that point were to be held constant. The X-value at that intercept point can then be used as the next value in the calibration process. Thus, according to Newton's Method, one manner in which error/MAPE for a given variable can be projected to be minimized is to estimate the derivative or instantaneous/local slope (in a manner described in greater detail below) at a point (say, point $P_1$) along the graph g(P) 20, shown as the slope of tangent line 22. The point $P_1$ can be the most recent point calculated by a simulation, or the point closest to zero for the value of MAPE, or selected otherwise. Once point $P_1$ is selected, the slope of tangent line 22 of the line 20 at point $P_1$ is then calculated and extrapolated until it intersects the X axis (at point $P_2$ of FIG. 10; the point of zero error/MAPE). Thus, in one case, the value for the parameter to be utilized during the next simulation is determined by the equation:

$$P_2 = P_1 - g(P_1)/g'(P_1) \qquad \text{(Equation 2)}$$

In the example of FIG. 10, then, the value of the variable v used in the next simulation would be the intercept of the slope line 22 with the X axis at point $P_2$; that is, five balls in the illustrated embodiment.

It is difficult if not impossible for any agent model to fully satisfy the assumptions of Newton's Method. Since the "function" g(P) is not a closed form function, which means the function g(P) cannot be accurately modeled by a mathematical equation, not to speak of differentiable one. However, the error in the agent model in question is continuous (changes gradually) with respect to its parameters, so this algorithm can benefit from the principles of Newton's Method by estimating the derivative instead of calculating the derivative. Therefore the local slope of the error curve at point $P_1$ may be estimated by obtaining another projected data point on the curve 20 and calculating the slope of the error function between the new, projected point and the point $P_1$.

In particular, in order to calculate the slope of tangent line 22 at point $P_1$ the simulation may be rerun using the same parameters used to generate point $P_1$, except the variable v of interest is increased (or decreased) slightly, while all other variables are held constant (or, if modified, done so in only minor manners). In other words the simulation is rerun using $(P_1+\Delta P)$ in place of $P_1$, and the resultant output of error (MAPE) is plotted. Point 24 in FIG. 10 represents the MAPE value when the simulation is run using $(P_1+\Delta P)$. The dotted line projection of curve 20 between point $P_1$ and point 24 $(P_1+\Delta P)$ can then be used to calculate the slope 22 of line 20 at point $P_1$. In particular the local slope 22 can be estimated as:

$$g'(P_1) \approx (g(P_1+\Delta P) - g(P_1))/\Delta P \quad \text{(Equation 3)}$$

Thus, once the slope $g'(P_1)$ (or $\delta g/\delta P_1$ in the case of a partial derivative) is estimated according to Equation 3, the slope value for $g'(P_1)$ can be used in Equation 2 to calculate the next value of the variable v to be used in the next "full-run" or final simulation to seek to minimize MAPE for the system as a whole (e.g. wherein the variable of interest is five balls in the example of FIG. 10).

The process of taking the value for a variable v, incrementally adjusting the value, calculating an error value, using that error value to estimate the local slope of the variable, and projecting the local slope to determine the next projected value for the variable to be run for the next simulation can then be repeated for each of the variables (e.g. five time, fifty times, or whatever is necessary to match the number of variables). Once the "next step" for each variable is calculated, a full-run simulation is carried out using the new (Newton's estimated) values for all variables. The resultant MAPE is then tracked and used as a basis for further calibration, as desired. This process of generating a projected values for each variable, running a full run simulation, and examining MAPE can then be repeated as many times as desired.

Figure 11:
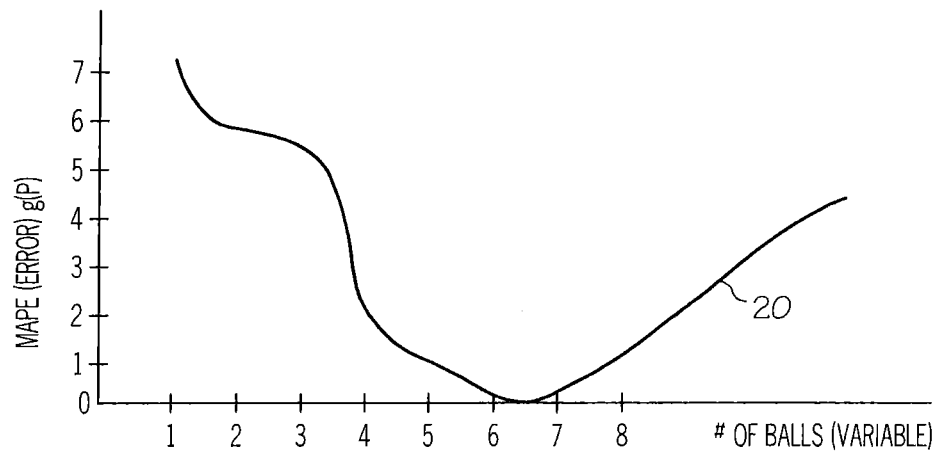

FIG. 11 illustrates the case where many more data points for the line function g(P), compared to FIG. 10, have been generated using this algorithm. The algorithm may then be repeated until error/MAPE reaches a minimum and/or begins to increase. In other words, the method iteratively calculates MAPE using the above recursive sequence until the values converge to a minimum (if they do in fact converge), or until a predetermined number of iterations is reached. As shown in FIG. 11, after the auto-calibration process is complete, a locally defined curve showing values of error/MAPE for various values of the variable/parameter may be inferred in which it can be seen that one or more particular values for the parameter provide a minimum, or acceptable error. For example, as shown in FIG. 11, the value for MAPE is minimized when the variable v is about 6.5 balls, which could then be taken as the optimal value once the optimization process is complete.

The system/algorithm outlined above generally follows Newton's Method for finding minimum values of functions. However, the system/algorithm slightly differs from Newton's Method in that Newton's Method is, in theory, only valid for use in closed-form, differentiable functions, whereas the function/curve for MAPE/errors will generally not be in a closed form. This system thus can also be thought of as an extrapolative, multi-dimensional, local-to-the-current-parameter-set application of the intercept method. Thus, using this system, estimates of partial derivatives applied to every variable can be estimated, which provide an intelligent trajectory towards the minimal error scenario.

Figure 12:
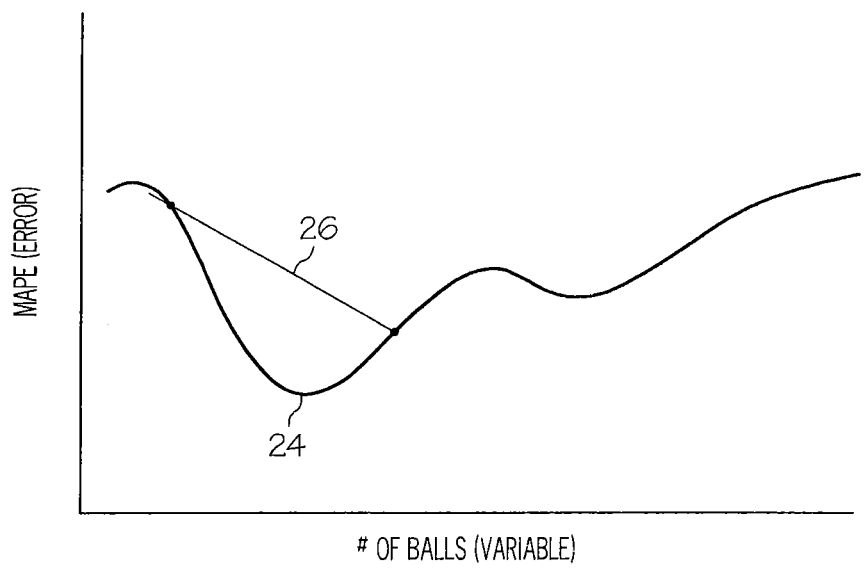
FIG. 12 is a graph illustrating the relationship between error (MAPE) and a particular variable.

As noted above, Equation 2, derived from Newton's Method, can be utilized to calculate the next value for the parameter to be utilized in the next simulation. Equation 2 provides a "full step" for determining the next value of the parameter. However, in some cases, it may be desired to take less than the "full step" as the next value for the parameter (i.e. moving from four balls to five balls in the example of FIG. 10). In particular, as shown in FIG. 12, in some cases the MAPE curve can have various minimums, and a minimum (such as minimum 24) can be overstepped if a full step (illustrated by the angled line 26 of FIG. 12) is utilized. Accordingly, in order to minimize the possibility of overstepping minima of the MAPE curve, some fraction of the full step provided by Newton's Method/Equation 2 may be implemented. Even partial steps can be sufficient to cause significant changes in MAPE.

When this "partial step" methodology is utilized, various techniques can be implemented for determining how large a portion of the full step is actually implemented. For example, when the parameter of interest is a marketing parameter, the system may apply a ratio of the marketing parameter, as compared to the total number of marketing parameters of the system, to the projected step. By way of example, if there are six marketing parameters under consideration by the system, then the system may implement ⅙ of a full step projected under the method outlined above. The fraction or percentage of the adjustment step can also be adjusted by various other methods and can be determined by various other ratios such as, for example, the number of modeled items in a forecast, or by considering other ratios. When PPP is being optimized under the auto-calibration process, a truncated step may also be similarly applied. In other cases, the full step projected by Newton's Method, or multipliers of that step (i.e. multiplier of less than one, or even more than one) can be implemented.

In some cases, other factors, besides MAPE, may be taken into consideration before the projected adjustment to a parameter is accepted. In other words, if a proposed adjustment to a parameter would decrease certain other goals of the system, then the proposed adjustment to a variable may be rejected, regardless of the effect upon MAPE. Such a concept is termed "selfishness" herein on the basis that the optimization should ultimately be carried out in a manner which seeks to meet the overall goals of the system designer.

In some cases, the characteristics of certain variables are generally desired to be driven in a certain manner, regardless of the effect upon overall MAPE. For example, when the system is optimizing values relating to customer awareness of a brand, it may be known or assumed that in certain cases (i.e. in the case of a mature brand) customer awareness over time remains generally constant (i.e. over the course of the simulation). In this case, when values which affect awareness are being optimized, rather than seeking to minimize MAPE, the method described above can be utilized to ensure awareness remains constant.

For example, the graphs of FIGS. 10-12, illustrating various values of MAPE as function of a particular variable, could instead map the values for MAPE added to the absolute value of average slope of changes in awareness. In other words, parameters affecting awareness may be modified such that the average value of the slope of the "awareness frequency curve" over time is minimized. Alternately, rather than simply minimizing MAPE and possibly seeking to keep awareness constant, combinations of these factors can be considered in seeking the appropriate parameter values. In this case, or further alternately, the system can seek to minimize "total error" which can be defined as a combination of the change of awareness over time (or some other variable of interest) and MAPE. Further alternately, the principles of selfishness may force short term increases in MAPE since the long term goal of the system is to find a global minimum for MAPE. The system may thus know that a temporarily/local increase of MAPE is in many cases necessary in order to find a global minimum for MAPE. Thus the simulations can be carried out in a manner which actually increase MAPE, so long as the other (long term) goals are being reached.

The following illustrative parameters for use in tracking purchasing behavior, among others, can be calibrated during the calibration period: 1) the overall reach of competitive media; 2) the impact of seeing a product on the shelf at a store or at one's home; 3) the speed at which advertising or other impressions are forgotten; 4) the strength of various types of media (in terms of its ability to change purchase probabilities); 5) the mean of the underlying distribution of preference for a brand; 6) the cause of sales trends for particular brands; and 7) price elasticity of a promotion. However, the number and type of parameters to be optimized can vary widely depending upon the nature of the simulation, the ABM system, the outputs desired, etc.

Moreover, not all variables/parameters of the system may necessarily need to be optimized. In particular, it may be determined that changes in particular parameters/variables may affect the ultimate results/data (e.g. sales) so insignificantly such that it is not worth the resources to carry out the optimization process for those variables. It may also be desired to first optimize parameters which are known, or suspected, to introduce the most variability into the system.

For example, in the marketing context, the system may first run a series of test simulations in which each media-based variable or parameter is adjusted by the same incremental or percentage amount $\Delta P$, while all other variables remain constant. The results of the test simulations, and in particular magnitude of the change in MAPE or other outcome, are then examined. Those variable which cause a sufficient change in MAPE or outcome may be considered for further optimization, while those that do not cause a sufficient change in MAPE or outcome may be dropped from the optimization process. In one case, a variable may proceed to the optimization process only if the incremental adjustment $\Delta P$ changes the MAPE or outcome of the simulation by a value that exceeds the error for the associated simulation.

The system may also be configured that variables are optimized in order. In other words, those variables that cause the largest change in MAPE or outcome during the test simulations can be optimized first. In this manner the system first focuses upon what is expected to be the more significant parameters (i.e. the "grosser" parameters), and then progressively optimizes the "finer" parameters.

In one embodiment, only system-wide parameters, such as PPP or other parameters which apply equally to each agent, may be optimized using this system. However, it may also be possible to use this system to optimize parameters which are agent-specific, including variables relating to the Polya Urn model, AFR, PP, and others.

As noted above, this optimization process can be carried out automatically by computer, processor, or the like without human intervention. This represents a significant improvement over many existing methods in which the operator would run a simulation, review the results, and manually adjust one or more variables. The simulation would then be run again, and the results reviewed. This is a highly labor-intensive, time-consuming and repetitive process. In contrast, the present auto-calibration system enables the system to calibrate parameters automatically, which can then be presented to an operator for confirmation and/or manual adjustment, if desired.

Due to the high volume of data needed to be tracked and calculated, the system can be computer-implemented. For example, a computer can be used to set up and/or administer the program, and carry out the steps, processes and methodologies outlined above, including creating storing and tracking the identity of and information relating to the agents, their parameters, MAPE, optimization steps and parameters, awareness models, etc. As used herein "computer" means computers, laptop computers, computer components and elements of a computer, such as hardware, firmware, virtualized hardware and firmware, combinations thereof, tablet computers, mobile devices, smart phones, or software in execution. One or more computers can reside in or on a server in various embodiments and the server can itself be comprised of multiple computers. One or more computers can reside within a process and/or thread of execution, and a computer can be localized at one location and/or distributed between two or more locations.

The computer can include a memory, a processor, and a user interface (which can include, for example, a keyboard, mouse or other cursor control device, other input devices, screen/monitor, printer, other output device etc.) to receive inputs from, and provide outputs to, a user. The computer can be operatively coupled to a database which can store information relating to the agents, their parameters, MAPE, optimization steps and parameters, awareness models, etc. As used herein "database" means any of a number of different data stores that provide searchable indices for storing, locating and retrieving data, including without limitation, relational databases, associative databases, hierarchical databases, object-oriented databases, network model databases, dictionaries, flat file/XML datastores, flat file systems with spidering or semantic indexing, and the like. Alternately, or in addition, the same information can be stored in the memory of the computer, which can also be considered a database.

Moreover, such information, including but not limited to the identity of and information relating to the agents, their parameters, MAPE, optimization steps and parameters, awareness models, etc. can be stored on software stored in the memory and/or the processor. The software may be able to be read/processed/acted upon by the processor. As used herein, "software" means one or more computer readable and/or executable instructions or programs that cause a computer/processor/device to perform functions, actions and/or behave in a desired manner. The instructions may be embodied in various forms such as routines, algorithms, modules, methods, threads, and/or programs. Software may also be implemented in a variety of executable and/or loadable forms including, but not limited to, stand-alone programs, function calls (local and/or remote), servlets, applets, instructions stored in a memory, part of an operating system or browser, bytecode, interpreted scripts and the like. It should be appreciated that the computer readable and/or executable instructions can be located on one computer and/or distributed between two or more communicating, co-operating, and/or parallel processing computers or the like and thus can be loaded and/or executed in serial, parallel, massively parallel and other manners. It should also be appreciated that the form of software may be dependent on various factors, such as the requirements of a desired application, the environment in which it runs, and/or the desires of a particular designer/programmer. The software may be stored on a tangible medium, such as memory, on a hard drive, on a compact disc, RAM memory, flash drive, etc., which can exclude signals, such as transitory signals and/or non-statutory transitory signals.

The computer running the program can also be connected to the internet to receive inputs and provide outputs. The computer can communicate with the internet or other computers via computer communications. For the purposes of this application "computer communications" means communication between two or more computers or electronic devices, and can take the form of, for example, a network transfer, a file transfer, an applet transfer, an email, a hypertext transfer protocol (HTTP) message, a datagram, an object transfer, a binary large object (BLOB) transfer, and so on. Computer communication can occur across a variety of mediums by a variety of protocols, for example, a wireless system (e.g., IEEE 802.11), an Ethernet system (e.g., IEEE 802.3), a token ring system (e.g., IEEE 802.5), a local area network (LAN), a wide area network (WAN), a point-to-point system, a circuit switching system, a packet switching system, and various other systems.

The various functions described above may be provided or contained in its own module. For example, the system may include or utilize a running module for running the agent-based simulation based upon a set of parameters, an error module for determining an error of a simulation, a revised value module for determining a revised value for one of the parameters of the set of parameters, a re-running module for re-running the simulation utilizing the revised value of the one of the parameters, a tracking ratio for tracking a ratio of indicators for each agent, a varying module for varying the ratio of indicators for an agent upon the occurrence of a triggering event for that agent, a using module for using the ratio as a factor to model the agent's awareness, a receiving or selecting module for receiving or selecting a first numerical value for assigning an attribute of an agent, a random receiving or selecting module for receiving or selecting a random numerical value, a first blending module for blending the first and random numerical values, a second blending module for blending the intermediate result with the first numerical value, or the random numerical value, or with a second numerical value, and a utilizing module for utilizing the end value to assign the attribute of the agent in the agent-based model. Each module can be a block of software, code, instructions or the like which, when run on a computer, provide the desired functions. Each module may be able to interact with the other modules, and may not necessarily be discrete and separate from the other modules, the ABM system, or other components of the system. The modules in the system may be functionally and/or physically separated, but can share data, outputs, inputs, or the like to operate as a single system and provide the functions described herein.

The outcome/results of the ABM/simulations can be used to determine and implement marketing strategies and behaviour, or as part of a marketing plan, including drawing up and implementing marketing plans, marking and selling products, displaying advertising, etc.

Although the invention is shown and described with respect to certain embodiments, it should be clear that modifications will occur to those skilled in the art upon reading and understanding the specification, and the present invention includes all such modifications.

What is claimed is:

1. A method for assigning an attribute to an agent or a plurality of agents for use in an agent based model, comprising:
   receiving or selecting a first numerical value for assigning an attribute of an agent in an agent-based model;
   receiving or selecting a random numerical value;
   blending the first and random numerical values, resulting in an intermediate value;
   blending the intermediate result with the first numerical value, or the random numerical value, or with a second numerical value, resulting in an end value;
   utilizing the end value to assign the attribute of the agent in the agent-based model;
   repeating both of the receiving or selecting steps, both of the blending steps, and the utilizing step a plurality of times to define a plurality of attributes for the agent or to define an attribute for a plurality of agents; and
   introducing said agent or agents to a stimulus and determining a reaction of said agent or agents to simulate human behavior, and wherein the first and second blending steps include blending the associated values according to the following equation:

$$g(u_1, u_2) = \begin{cases} \dfrac{(u_1 + u_2)^2}{2} & \text{if } u_1 + u_2 < 1 \\ \dfrac{2 - (2 - u_1 - u_2)^2}{2} & \text{otherwise} \end{cases}$$

wherein $u_1$ represents a first value to be blended, $u_2$ represents a second value to be blended, and $g(u_1, u_2)$ represents an output of the blending step.

2. The method of claim 1 wherein the first numerical value, the random numerical value, the intermediate value and the second numerical values are each sampled from uniformly distributed variables.

3. The method of claim 2 wherein the first numerical value, the random numerical value, the intermediate value and the second numerical values each range between 0 and 1.

4. The method of claim 1 wherein the second blending step includes blending the intermediate result with the first numerical value.

5. The method of claim 1 wherein the second blending step includes blending the intermediate result with the random numerical value.

6. The method of claim 1 wherein the second blending step includes blending the intermediate result with the second numerical value.

7. The method of claim 1 wherein the method further includes assigning an attribute of the agent in the agent-based model by calculating the inverse of the end value with respect to the cumulative distribution function for the attribute.

8. The method of claim 1 further including the step of utilizing the first value to assign a supplemental attribute of the agent in the agent-based model, wherein the supplemental attribute is different from the attribute.

9. The method of claim 8 wherein the attribute is income and the supplemental attribute is age.

10. The method of claim 8 wherein the supplemental attribute is a predictive attribute with respect to the attribute.

11. The method of claim 8 wherein the step of utilizing the first value to assign the supplemental attribute includes calculating the inverse of the first value with respect to the cumulative distribution function for the supplemental attribute.

12. The method of claim 1 wherein the attribute includes at least one of sex, age, race, income, TV watching habits, Internet usage habits, radio listening habits, price sensitivity, purchase history, purchase occasions or quality sensitivity.

13. The method of claim 1 wherein the end value is further manipulated before being utilized to assign the attribute of the agent.

14. The method of claim 1 further including the step of, after the second blending step, blending the end value with the first numerical value, or the random numerical value, or with a second numerical value, resulting in a supplemental end value, wherein the utilizing step includes assigning an attribute of the agent in the agent-based model, at least partially utilizing the supplemental end value.

15. The method of claim 1 wherein the method is implemented on a processor which carries out both receiving or selecting steps, both blending steps, and the utilizing step.

16. The method of claim 1 further comprising the steps of repeating both of the receiving or selecting steps, both of the blending steps, and the utilizing steps a plurality of times to define a plurality of attributes for the agent, and repeating the method for a plurality of agents such that each agent has a plurality of assigned attributes, and wherein the introducing step includes introducing each agent to a stimuli and determining the reaction of each agent to simulate human behavior.

17. A system for assigning an attribute to an agent or a plurality of agents for use in an agent-based model, comprising: a processor, wherein the system is configured to:
receive or select a first numerical value;
receive or select a random numerical value;
blend the first and random numerical values, resulting in an intermediate value;
blend the intermediate result with the first numerical value, or the random numerical value, or with a second numerical value, resulting in an end value;
utilize the end value, or a further manipulation thereof, to assign the attribute of the agent or the plurality of agents in the agent-based model;
wherein the system is configured to repeat both of the receive or select steps, both of the blending steps, and the utilize step a plurality of times to define a plurality of attributes for the agent or to define an attribute for a plurality of agents; and
wherein the system is configured to introduce said agent or agents to a stimulus and determine a reaction of said agent or agents to simulate human behavior, and wherein the wherein the system is configured to blend the associated values in the first and second blend steps according to the following equation:

$$g(u_1, u_2) = \begin{cases} \dfrac{(u_1 + u_2)^2}{2} & \text{if } u_1 + u_2 < 1 \\ \dfrac{2 - (2 - u_1 - u_2)^2}{2} & \text{otherwise} \end{cases}$$

wherein $u_1$ represents a first value to be blended, $u_2$ represents a second value to be blended, and $g(u_1,u_2)$ represents an output of the blending step.

18. The system of claim 17 wherein the system includes a computer and software stored on tangible computer-readable media which, when read, causes the computer to perform the receiving or selecting functions, the blending functions, and the utilizing function.

* * * * *

UNITED STATES PATENT AND TRADEMARK OFFICE
CERTIFICATE OF CORRECTION

PATENT NO. : 9,070,135 B2
APPLICATION NO. : 13/667252
DATED : June 30, 2015
INVENTOR(S) : Theresa S. Sullivan and Sean P. Tunning Page 1 of 1

It is certified that error appears in the above-identified patent and that said Letters Patent is hereby corrected as shown below:

In the Specification

In Column 5, Line 12, Equation 1, it reads:

" $$g(u_1, u_2) = \begin{cases} \frac{(u_1 + u_2)^2}{2} & \text{if } u_1 + u_2 < 1 \\ \frac{(2-(2-u_1-u_2)^2}{2} & \text{otherwise} \end{cases}$$ "

It should read:

-- $$g(u_1, u_2) = \begin{cases} \frac{(u_1+u_2)^2}{2} & \text{if } u_1 + u_2 < 1 \\ \frac{2-(2-u_1-u_2)^2}{2} & \text{otherwise} \end{cases}$$ --

Signed and Sealed this
Third Day of November, 2015

Michelle K. Lee
*Director of the United States Patent and Trademark Office*